United States Patent
Park et al.

(10) Patent No.: US 10,476,038 B2
(45) Date of Patent: Nov. 12, 2019

(54) DISPLAY DEVICE

(71) Applicant: Samsung Display Co., Ltd., Yongin-si, Gyeonggi-do (KR)

(72) Inventors: Kwang Woo Park, Hwaseong-si (KR); Jeong Won Kim, Seoul (KR); Hyeon Bum Lee, Hwaseong-si (KR); Jin-Whan Jung, Chungcheongnam-do (KR); Jin Ho Ju, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/955,422

(22) Filed: Apr. 17, 2018

(65) Prior Publication Data

US 2019/0088906 A1   Mar. 21, 2019

(30) Foreign Application Priority Data

Sep. 20, 2017   (KR) .................. 10-2017-0121306

(51) Int. Cl.
*H01L 51/52* (2006.01)
*H01L 27/32* (2006.01)
(Continued)

(52) U.S. Cl.
CPC .......... *H01L 51/5284* (2013.01); *G06F 3/041* (2013.01); *G06F 3/044* (2013.01);
(Continued)

(58) Field of Classification Search
CPC . H01L 27/322; H01L 27/323; H01L 51/5218; H01L 51/5234; H01L 51/5253;
(Continued)

(56) References Cited

U.S. PATENT DOCUMENTS

2011/0121299 A1*   5/2011   Kim .................... H01L 27/1225
                                                               257/59
2016/0322444 A1   11/2016   Kang et al.
(Continued)

FOREIGN PATENT DOCUMENTS

| KR | 10-1035358 B1 | 5/2011 |
| KR | 10-2017-0036217 A | 4/2017 |
| KR | 10-1750428 B1 | 6/2017 |

OTHER PUBLICATIONS

Extended European Search Report corresponding to European Patent Application No. 18179711.9 dated Dec. 14, 2018, 8 pages.

*Primary Examiner* — Hong Zhou
(74) *Attorney, Agent, or Firm* — Innovation Counsel LLP

(57) ABSTRACT

A display device may include a switching composite layer, a first electrode, a pixel defining layer, an emission layer, a second electrode, an encapsulation layer, a light blocking layer, and a touch sensor. The first electrode is positioned on the switching composite layer. The pixel defining layer covers an edge of the first electrode and has a first opening and a second opening that are spaced from each other. The emission layer is positioned inside the first opening. The second electrode covers the switching composite layer, the pixel defining layer, and the emission layer. The encapsulation layer covers the second electrode. The light blocking layer is positioned on the encapsulation layer. The touch sensor is positioned on the light blocking layer and includes a sensing electrode set. A material portion is positioned inside the second opening of the pixel defining layer and overlaps the sensing electrode set.

20 Claims, 12 Drawing Sheets

(51) Int. Cl.
*G06F 3/041* (2006.01)
*G06F 3/044* (2006.01)

(52) U.S. Cl.
CPC ........ *H01L 27/323* (2013.01); *H01L 27/3206* (2013.01); *H01L 27/3246* (2013.01); *H01L 51/5218* (2013.01); *H01L 51/5234* (2013.01); *H01L 51/5253* (2013.01); *H01L 51/5265* (2013.01); *G06F 2203/04103* (2013.01); *H01L 27/322* (2013.01); *H01L 2251/5315* (2013.01)

(58) Field of Classification Search
CPC ......... H01L 51/5284; H01L 2251/5315; H01L 2251/5265; H01L 27/3246; H01L 27/3206; G06F 2203/04103; G06F 3/044; G06F 2203/04102; G06F 2203/04111; G06F 3/0412; G06F 3/0416; G06F 3/047
See application file for complete search history.

(56) References Cited

U.S. PATENT DOCUMENTS

| | | |
|---|---|---|
| 2016/0378224 A1 | 12/2016 | Kwon et al. |
| 2017/0090634 A1 | 3/2017 | Yang et al. |
| 2018/0095582 A1* | 4/2018 | Hwang ................ G06F 3/0412 |
| 2018/0166507 A1* | 6/2018 | Hwang ................ H01L 27/323 |

* cited by examiner

DISPLAY DEVICE

CROSS-REFERENCE TO RELATED APPLICATION

This application claims priority to and the benefit of Korean Patent Application No. 10-2017-0121306 filed in the Korean Intellectual Property Office on Sep. 20, 2017; the entire contents of the Korean Patent Application are incorporated herein by reference.

BACKGROUND

1. Field

The technical field relates to a display device. More particularly, the technical field relates to a display device including a touch sensor.

2. Description of the Related Art

A display device may include a touch sensor, which allows a user to input information by contacting a screen using a finger, a pen, etc. As an example, the touch sensor may be a capacitive-type sensor for sensing a position where a contact causes capacitance to vary.

The above information disclosed in this Background section is for facilitating understanding of the background of the disclosure. The Background section may contain information that does not form the prior art that is already known in this country to a person of ordinary skill in the art.

SUMMARY

Embodiments may be related to a display device with satisfactory luminance, satisfactory touch sensitivity, a satisfactory viewing angle, and/or satisfactory reflection colors.

An embodiment provides a display device including: a substrate; a switching composite layer positioned on the substrate; a first electrode positioned on the switching composite layer; a pixel defining layer covering an edge of the first electrode and provided with a first opening and a second opening that are spaced apart from each other; an emission layer positioned in the first opening; a second electrode covering the switching composite layer, the pixel defining layer, and the emission layer; a thin film encapsulation layer covering the second electrode; a light blocking layer positioned on the thin film encapsulation layer; and a touch sensor positioned on the light blocking layer and including a sensing electrode, wherein the second opening of the pixel defining layer may overlap the sensing electrode.

The sensing electrode may include a plurality of conductive fine wires that are connected to each other and have a mesh shape, and the second opening of the pixel defining layer may overlap the conductive fine wire.

The light blocking layer may overlap the pixel defining layer.

The light blocking layer may overlap the second opening of the pixel defining layer.

The conductive fine wire may be spaced apart from the second opening of the pixel defining layer.

The second electrode may contact the switching composite layer at a position thereof corresponding to the second opening of the pixel defining layer.

A distance between the second electrode positioned in the second opening and the light blocking layer may be greater than a distance between the second electrode and the light blocking layer positioned on an upper surface of the pixel defining layer.

A distance between the second electrode positioned in the second opening and an upper surface of the thin film encapsulation layer may be greater than a distance between the second electrode positioned on the upper surface of the pixel defining layer and the upper surface of the thin film encapsulation layer.

A distance between adjacent light blocking layers may be greater than a size of the first opening.

The sensing electrode may include a first sensing electrode and a second sensing electrode spaced apart from each other in a plane view, the touch sensor may include a first insulating layer positioned between the light blocking layer and the sensing electrode, and a second insulating layer positioned between a part of the first sensing electrode and a part of the second sensing electrode, and the second insulating layer may include an inorganic material.

The touch sensor may include a third insulating layer covering the sensing electrode, and the third insulating layer may include an organic material.

The emission layer may be positioned between the plurality of conductive fine wires.

The display device may further include a polarizer positioned on the touch sensor, and a window positioned on the polarizer.

The display device may further include a cover layer positioned between the light blocking layer and the touch sensor.

The cover layer may include an organic material.

The sensing electrode may include a first sensing electrode and a second sensing electrode spaced apart from each other in a plane view, the touch sensor may include a first insulating layer positioned between the light blocking layer and the sensing electrode, and a second insulating layer positioned between a part of the first sensing electrode and a part of the second sensing electrode, the second insulating layer may include an inorganic material, and the cover layer may be positioned between the light blocking layer and the first insulating layer.

The display device may further include a color filter positioned between adjacent light blocking layers, wherein the color filter may be positioned on the thin film encapsulation layer.

The color filter may not overlap the conductive fine wire.

The display device may further include a cover layer covering the light blocking layer and the color filter, wherein the sensing electrode may include a first sensing electrode and a second sensing electrode spaced apart from each other in a plane view, the touch sensor may include a first insulating layer positioned between the light blocking layer and the sensing electrode, and a second insulating layer positioned between a part of the first sensing electrode and a part of the second sensing electrode, the second insulating layer may include an inorganic material, and the cover layer may be positioned between the light blocking layer and the first insulating layer.

The cover layer may include an organic material.

An embodiment may be related to a display device. The display device may include a substrate, a switching composite layer, a first electrode, a pixel defining layer, an emission layer, a second electrode, an encapsulation layer, a light blocking layer, and a touch sensor. The switching composite layer may be positioned on the substrate. The first electrode may be positioned on the switching composite layer. The pixel defining layer may cover an edge of the first electrode and may have a first opening and a second opening that may be spaced from each other. The emission layer may be positioned inside the first opening. The second electrode may cover each of the switching composite layer, the pixel defining layer, and the emission layer. The encapsulation layer may cover the second electrode. The light blocking layer may be positioned on the encapsulation layer. The touch sensor may be positioned on the light blocking layer and may include a sensing electrode set. A material portion may be positioned inside the second opening of the pixel defining layer and may overlap the sensing electrode set.

The material portion may be a portion of the second electrode or a portion of the encapsulation layer.

The sensing electrode set may include a mesh structure comprising conductive wires that may be electrically connected to each other and include a first conductive wire. The material portion may overlap the first conductive wire.

The light blocking layer may overlap the pixel defining layer.

The light blocking layer may overlap the material portion.

The first conductive wire may be spaced from the material portion.

The first conductive wire may be positioned between two edges of the second opening (in a plan view of the display device).

The material portion may be a first portion of the second electrode and may directly contact the switching composite layer.

A distance between the material portion and the light blocking layer may be greater than a distance between a second portion of the second electrode and the light blocking layer. The second portion of the second electrode may be positioned between the pixel defining layer and the light blocking layer in a direction perpendicular to the substrate.

A distance between the material portion and a flat surface of the encapsulation layer may be greater than a distance between the second portion of the second electrode positioned and the flat surface of the encapsulation layer. The flat surface of the encapsulation layer may be parallel to the substrate.

A distance between two spaced and immediately neighboring portions of the light blocking layer in a cross-sectional view of the display device may be greater than a width of the first opening in the cross-sectional view of the display device.

The sensing electrode set may include a first sensing electrode and a second sensing electrode spaced from each other in a plan view of the display device. The touch sensor may include a first insulating layer and a second insulating layer. The first insulating layer may be positioned between the light blocking layer and the sensing electrode set. The second insulating layer may include an insulating portion positioned between the first sensing electrode and the second sensing electrode. The second insulating layer may include (and/or may be formed of) an inorganic material.

The touch sensor may include a third insulating layer covering the sensing electrode set. The third insulating layer may include (and/or may be formed of) an organic material.

The emission layer may be positioned between two immediately neighboring conductive wires of the conductive wires.

The display device may include a polarizer positioned on the touch sensor and may include a window positioned on the polarizer.

The display device may include a cover layer positioned between the light blocking layer and the touch sensor.

The cover layer may include (and/or may be formed of) an organic material.

The sensing electrode set may include a first sensing electrode and a second sensing electrode spaced from each other in a plan view of the display device. The touch sensor may include a first insulating layer and a second insulating layer. The first insulating layer may be positioned between the light blocking layer and the sensing electrode. The second insulating layer may include an insulating portion positioned between the first sensing electrode and the second sensing electrode. The second insulating layer may include (and/or may be formed of) an inorganic material. The cover layer may be positioned between the light blocking layer and the first insulating layer.

The display device may include a color filter positioned between two spaced and immediately neighboring portions of the light blocking layer. The color filter may be positioned directly on the encapsulation layer.

The color filter may not overlap any conductive wire of the sensing electrode set in a direction perpendicular to the substrate.

The display device may include a cover layer covering the light blocking layer and the color filter. The sensing electrode set may include a first sensing electrode and a second sensing electrode spaced from each other in a plan view of the display device. The touch sensor may include a first insulating layer and a second insulating layer. The first insulating layer may be positioned between the light blocking layer and the sensing electrode. The second insulating layer may include an insulating portion positioned between the first sensing electrode and the second sensing electrode. The second insulating layer may include (and/or may be formed of) an inorganic material. The cover layer may be positioned between the light blocking layer and the first insulating layer.

The cover layer may include (and/or may be formed of) an organic material.

According to embodiments, an embedded touch sensor and/or a display device may minimize reflection of external light, may provide desirable reflection colors, may have satisfactory touch sensitivity, and/or may enable a satisfactory viewing angle.

DETAILED DESCRIPTION OF EMBODIMENTS

Figure 1:
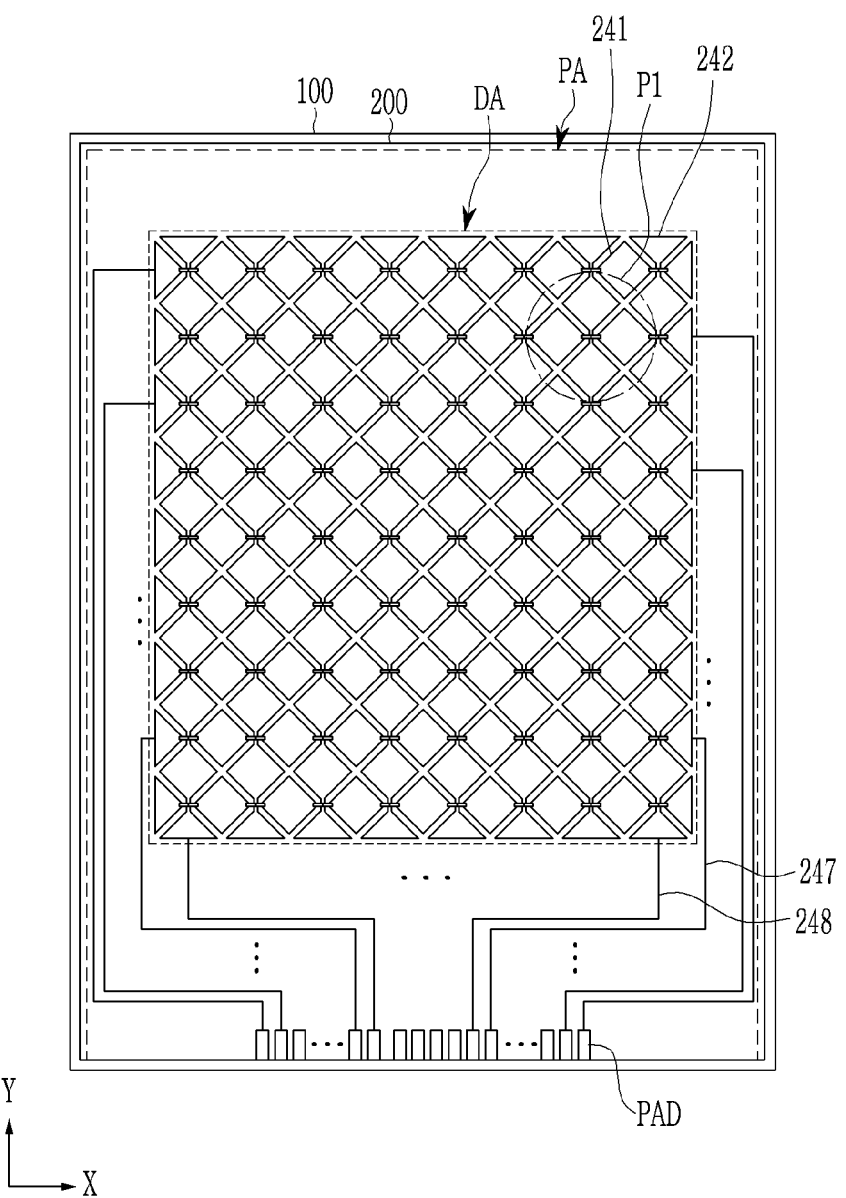
FIG. 1 illustrates a (top) plan view of a display device according to an embodiment.

Embodiments are described with reference to the accompanying drawings. As those skilled in the art would realize, the described embodiments may be modified in various ways.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

Like reference numerals may designate like elements.

In the drawings, thicknesses of layers, films, panels, regions, etc., may be exaggerated for clarity.

When a first element is referred to as being "on" a second element, the first element can be directly on the second element, or one or more intervening elements may be present between the first element and the second element. In contrast, when a first element is referred to as being "directly on" a second element, there are no intended intervening elements (except environmental elements such as air) present between the first element and the second element. The word "on" or "above" means positioned on or below an object, and does not necessarily mean positioned on the upper side of the object based on a gravitational direction.

Unless explicitly described to the contrary, the word "comprise" and variations such as "comprises" or "comprising" may imply the inclusion of stated elements but not the exclusion of any other elements.

The phrase "in a plan view" may mean viewing the object portion from above or the top.

The term "connect" may mean "electrically connect"; the term "insulate" may mean "electrically insulate."

Figure 2:
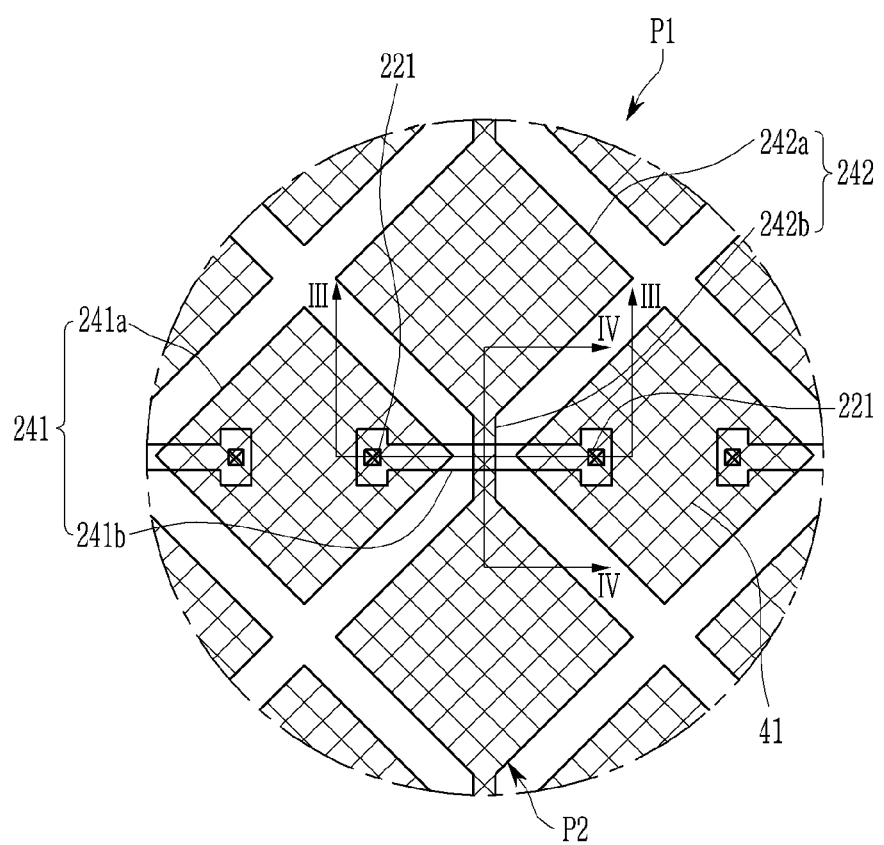
FIG. 2 illustrates a (top) plan view of a portion P1 of FIG. 1 according to an embodiment.
Figure 3:
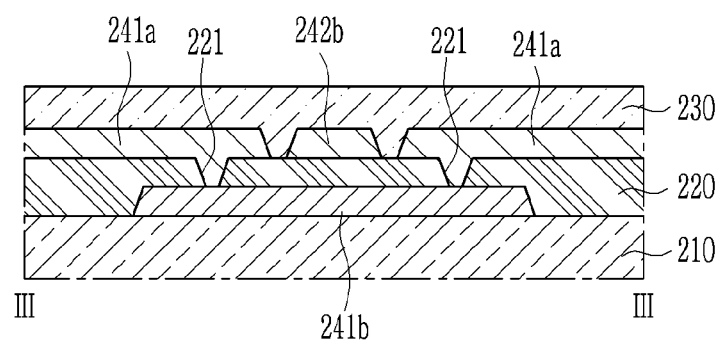
FIG. 3 illustrates a partial cross-sectional view taken along line III-III of FIG. 2 according to an embodiment.
Figure 4:
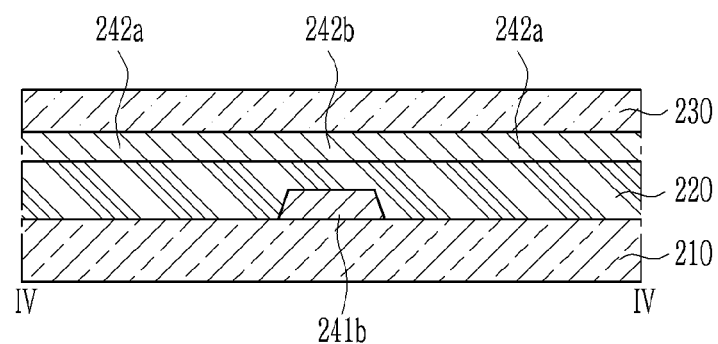
FIG. 4 illustrates a partial cross-sectional view taken along line IV-IV of FIG. 2 according to an embodiment.

FIG. 1 illustrates a top plan view of a display device according to an embodiment, FIG. 2 illustrates an (enlarged) top plan view of a portion P1 of FIG. 1 according to an embodiment, FIG. 3 illustrates a partial cross-sectional view taken along line III-III of FIG. 2 according to an embodiment, and FIG. 4 illustrates a partial cross-sectional view taken along line IV-IV of FIG. 2 according to an embodiment.

Referring to FIG. 1, the display device includes a display panel 100 for displaying an image, and a touch sensor 200 positioned on the display panel 100. The display panel 100 may be, for example, an organic light emitting device.

The display panel 100 may include a display area DA and a peripheral area PA outside the display area. The display area DA may include a plurality of pixels, and an image may be displayed on the display area DA. The peripheral area PA may be disposed on one side of the display area DA. In FIG. 1, the peripheral area PA surrounds the display area DA. The disposition of the display area DA and the peripheral area PA may be configured according to embodiments.

The touch sensor 200 may include sensing electrodes 241 and 242 positioned on the display area DA, and connecting wires 247 and 248 positioned on the peripheral area PA. In an embodiment, the sensing electrodes 241 and 242 are positioned on the display area DA, but embodiments are not limited thereto, and the sensing electrodes 241 and 242 may extend to the peripheral area PA. In an embodiment, each sensing electrode may be utilized as an operating portion for controlling the display device.

In the sensing electrodes 241 and 242, each first-type sensing electrode 241 (or first sensing electrode 241) extends in a first direction (X), and each second-type sensing electrode 242 (or second sensing electrode 242) extends in a second direction (Y) different from the first direction (X). In the connecting wires 247 and 248, the first connecting wire 247 is connected to the first sensing electrodes 241, and the second connecting wire 248 is connected to the second sensing electrodes 242.

In an embodiment, the first sensing electrodes 241 and the second sensing electrodes 242 sense a user's touch in a capacitance manner, a mutual capacitance manner, and/or a self-capacitance manner.

As shown in FIG. 2, a first sensing electrode 241 may include a plurality of first sensing cells 241a each having a substantially rhombic shape, and a plurality of first connecting portions 241b extending in the first direction (X) and connecting the first sensing cells 241a to each other. The first sensing electrode 241 may be a transmitter (Tx) touch electrode to which a first touch signal for sensing a coordinate value of the second direction (Y) is transmitted.

A second sensing electrode 242 may include a plurality of second sensing cells 242a each having a substantially rhombic shape, and a plurality of second connecting portions 242b extending in the second direction (Y) and connecting the plurality of second sensing cells 242a to each other. The second sensing electrode 242 may be a receiver (Rx) touch electrode to which a second touch signal for sensing a coordinate value of the first direction (X) is transmitted. In an embodiment, the first sensing cells 241a and the second sensing cells 242a may have one or more other shapes. In an embodiment, the first sensing electrodes 241 may be Rx touch electrodes, and the second sensing electrodes 242 may be Tx touch electrodes.

First sensing electrodes 241 and second sensing electrodes 242 may be respectively connected to pad portions (PAD) through a first connecting wire 247 and a second connecting wire 248. The pad portions (PAD) may be connected to a controller (not shown) to transmit the first touch signal and the second touch signal to the sensing electrodes 241 and 242.

The first sensing electrodes 241 and the second sensing electrodes 242 are spaced apart from each other by a predetermined interval, and a capacitance may be formed between the first sensing electrodes 241 and the second sensing electrodes 242. When a touch operation is performed by a user, capacitance formed between a first sensing electrode 241 and a second sensing electrode 242 is changed, and the changed capacitance is detected by a controller (not shown), for sensing a touch position.

When viewed in a plan view, the first sensing cells 241a and the second sensing cells 242a are adjacent to each other, and the first connecting portions 241b and the second connecting portions 242b cross each other, but they may be insulated by a second insulating layer 220.

The first sensing cells 241a, the second sensing cells 242a, and the second connecting portions 242b may be positioned on the same layer. The first connecting portions 241b may be positioned on a different layer from the first sensing cells 241a, the second sensing cells 242a, and the second connecting portions 242b. Specifically, the first connecting portions 241b may be positioned below the first sensing cells 241a, the second sensing cells 242a, and the second connecting portions 242b. The first connecting portions 241b is positioned on a first insulating layer 210. The first insulating layer 210 may be positioned between the first connecting portions 241b and the display panel 100. The second insulating layer 220 may be positioned on the first connecting portions 241b, and the second insulating layer 220 may be provided with a contact hole 221 overlapping the first connecting portions 241b. The first sensing cells 241a, the second sensing cells 242a, and the second connecting portions 242b may be positioned on the second insulating layer 220. The first sensing cells 241a may be connected to the first connecting portions 241b through the contact hole 221.

The second sensing cells 242a and the second connecting portions 242b of the second sensing electrode 242 may be integrally formed. Therefore, in the same process, the first sensing cells 241a, the second sensing cells 242a, and the second connecting portions 242b may be simultaneously formed. In an embodiment, the second connecting portions 242b is not necessarily simultaneously formed with the first sensing cells 241a and the second sensing cells 242a, and they may be separately formed with another material in another process.

In an embodiment, the second connecting portions 242b may be positioned on a different layer from the first sensing cells 241a, the second sensing cells 242a, and the first connecting portions 241b.

The sensing electrodes 241 and 242 may include low resistance metals such as silver (Ag), aluminum (Al), copper (Cu), chromium (Cr), and nickel (Ni), or may include conductive nanomaterials such as silver nanowires, carbon nanotubes, and the like. Since resistance of the sensing electrodes 241 and 242 is low, an RC delay may be reduced, and since they have excellent flexibility, cracks do not easily occur even by repeated deformation such as bending.

The first insulating layer 210 and the second insulating layer 220 may include (and/or may be formed of) an inorganic material. In an embodiment, the inorganic material may include one of an aluminum oxide, a titanium oxide, a silicon oxide, a silicon oxynitride, a zirconium oxide, a hafnium oxide, and a combination.

In an embodiment, the materials of the first insulating layer 210 and the second insulating layer 220 may include an organic material. In an embodiment, the organic material may include one of an acrylic resin, a methacrylic resin, a polyisoprene, a vinyl resin, an epoxy resin, a urethane resin, a cellulose resin, a siloxane resin, a polyimide resin, a polyamide resin, and a combination.

The touch sensor 200 may have a mesh structure. That is, the sensing electrodes 241 and 242 and the connecting wires 247 and 248 may include a plurality of conductive fine wires 41. In FIG. 2, the sensing electrodes 241 and 242 and the connecting wires 247 and 248 are shown to include conductive fine wires 41, but, for ease of description and/or illustration, the conductive fine wires 41 are not specifically shown in FIGS. 3 and 4.

Since the sensing electrodes 241 and 242 include conductive fine wires 41 and have a mesh structure, the sensing electrodes 241 and 242 do not significant block light emitted from the display panel 100, and overlap between the sensing electrodes and conductive wires of the display panel 100 may be minimized, such that parasitic capacitance may be minimized.

In addition, the touch sensor 200 uses the display panel 100 as a support plate without using its own support plate. Thus, an entire thickness of the touch sensor 200 may be minimized, and the display device may be desirably flexible.

Figure 5:
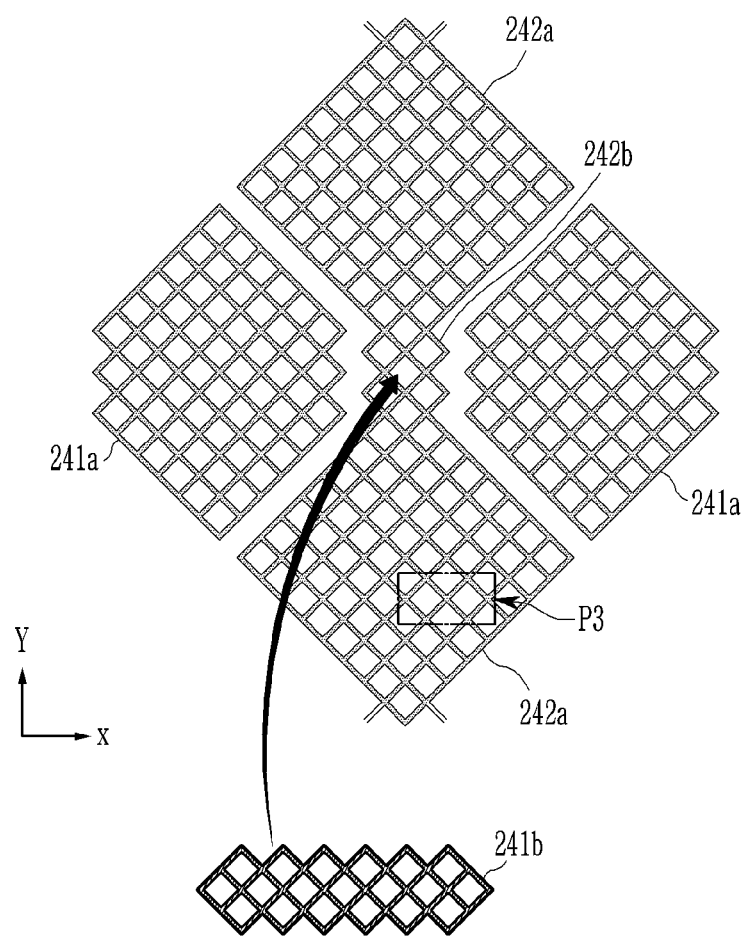
FIG. 5 is an (exploded) view of a portion P2 of FIG. 2 showing a first sensing cell, a second sensing cell, a second connecting portion, and a first connecting portion positioned below the second connecting portion according to an embodiment.
Figure 6:
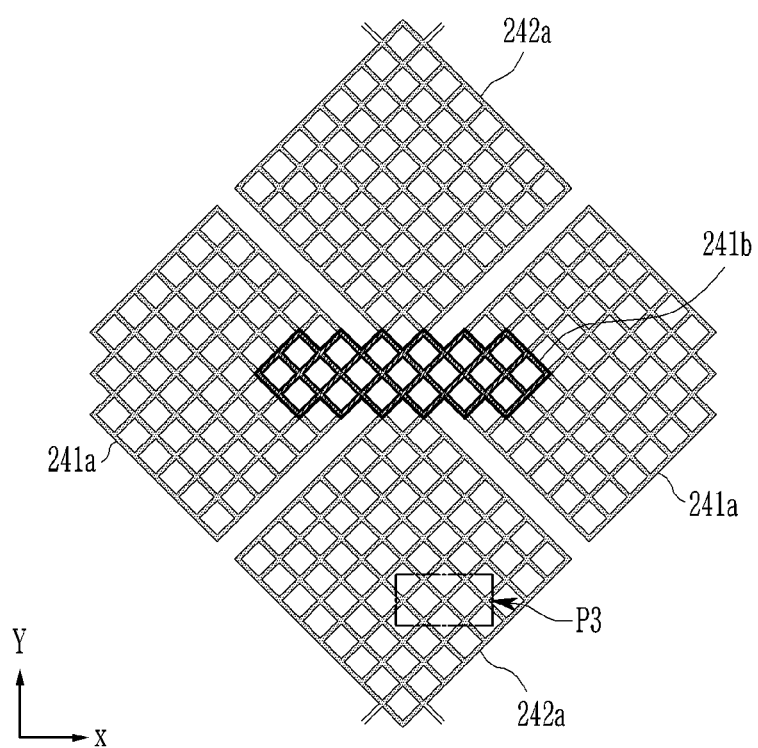
FIG. 6 illustrates a (top) plan view of a portion P2 of FIG. 2 according to an embodiment.
Figure 7:
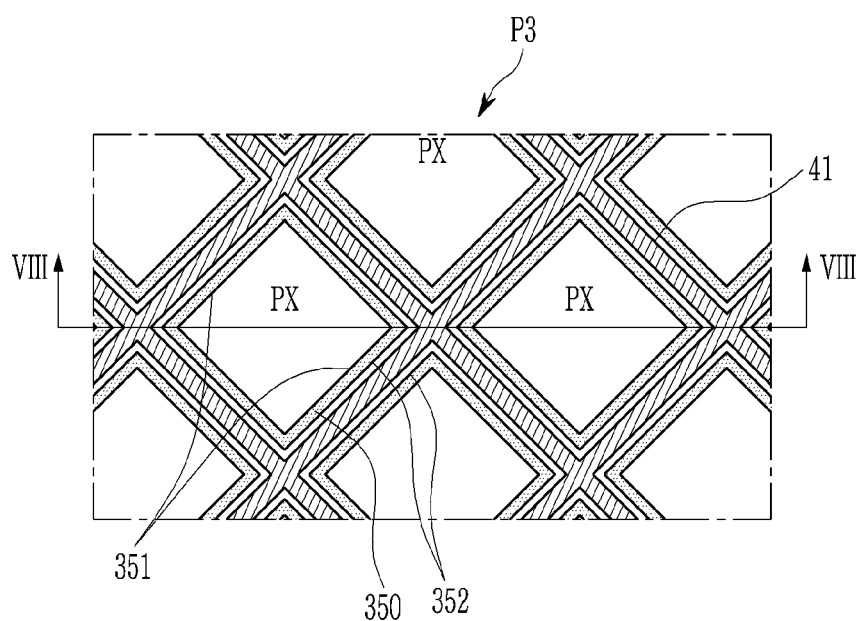
FIG. 7 is a (top) plan view of a portion P3 of FIG. 6 showing a conductive fine wire and a pixel defining layer according to an embodiment.
Figure 8:
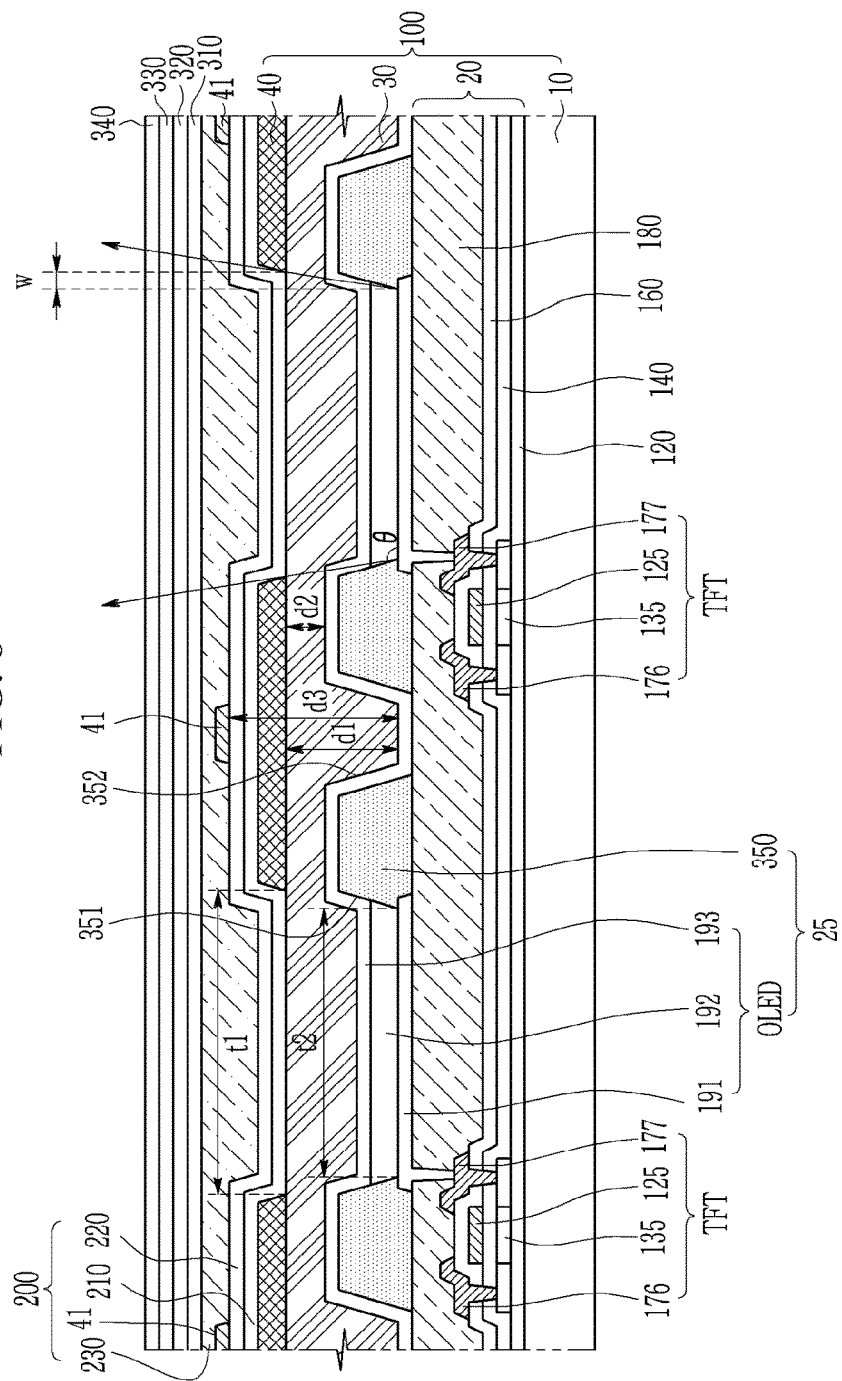
FIG. 8 illustrates a cross-sectional view taken along line VIII-VIII of FIG. 7 according to an embodiment.

FIG. 5 is an enlarged (exploded) view of a portion P2 of FIG. 2 showing a first sensing cell, a second sensing cell, a second connecting portion, and a first connecting portion positioned below the second connecting portion according to an embodiment, and FIG. 6 illustrates an enlarged top plan view of a portion P2 of FIG. 2 according to an embodiment. FIG. 7 is an enlarged top plan view of a portion P3 of FIG. 6 showing a conductive fine wire and a pixel defining layer according to an embodiment, and FIG. 8 illustrates a cross-sectional view taken along line VIII-VIII of FIG. 7 according to an embodiment.

Referring to FIG. 5 and FIG. 6, the first sensing electrode 241 and the second sensing electrode 242 may include conductive fine wires 41 that form mesh structures.

Specifically, the first sensing cells 241a, the second sensing cells 242a, and the second connecting portions 242b, which are positioned on the same layer, may include conductive fine wires 41. The first connecting portions 241b that overlap the first sensing cells 241a and the second connecting portions 242b and are positioned below them may also include conductive fine wires 41.

As shown in FIG. 7, a pixel defining layer 350 may include a first opening 351 corresponding a pixel PX and may include a second opening 352 positioned between adjacent (or immediately neighboring) pixels PX. Thus, the pixel defining layer 350 may have a structure including a plurality of connected, square/rhombus-shaped rings.

Since the pixel defining layer 350 has the second opening 352 formed between the adjacent pixels PX, the pixel defining layer 350 does not overlap the plurality of conductive fine wires 41 in a direction perpendicular to the substrate 10.

As shown in FIG. 8, the display device may include the display panel 100 and the touch sensor 200 positioned on the display panel 100.

The display panel 100 may include a substrate 10, a switching composite layer 20 positioned on the substrate 10, a light emitting member 25 positioned on the switching composite layer 20, a thin film encapsulation layer 30 covering the light emitting member 25, and a light blocking layer 40 positioned on the thin film encapsulation layer 30. In an embodiment, the touch sensor 200 may be positioned on the light blocking layer 40.

The substrate 10 may be an insulating substrate made of glass, quartz, ceramics, plastic, or the like, or a metallic substrate made of stainless steel or the like.

The switching composite layer 20 may include a buffer layer 120, a semiconductor 135, a gate insulating layer 140, a gate electrode 125, an interlayer insulating layer 160, a source electrode 176, a drain electrode 177, and a planarization layer 180 which are sequentially positioned on the substrate 10.

The buffer layer 120 improves characteristics of polysilicon by blocking impurities from the substrate 10 during a crystallization process for forming the polysilicon. In addition, the buffer layer 120 serves to reduce stress of the semiconductor 135 formed on the buffer layer 120 by planarizing the substrate 10. The buffer layer 120 may be made of a silicon nitride (SiNx), a silicon oxide SiO$_x$, or the like.

The semiconductor 135 may be positioned on the buffer layer 120 of the display area DA. The semiconductor 135 may be made of a polysilicon or an oxide semiconductor. The semiconductor 135 includes a channel region and includes a source region and a drain region, which are positioned at opposite sides of the channel region and are doped with an impurity. The gate insulating layer 140 may be positioned on the semiconductor 135, and the gate electrode 125 may be positioned on the gate insulating layer 140. The gate electrode 125 overlaps the channel region of the semiconductor 135. The gate insulating layer 140 may be made of a silicon nitride (SiNx), a silicon oxide (SiO$_x$), or the like.

The interlayer insulating layer 160 may be positioned on the gate electrode 125, and the source electrode 176 and the drain electrode 177 may be positioned on the interlayer insulating layer 160. The source electrode 176 and the drain electrode 177 are connected to the source region and the drain region of the semiconductor 135 through contact holes provided in the interlayer insulating layer 160 and the gate insulating layer 140. The thin film transistor (TFT) shown in FIG. 7 is a driving thin film transistor, and may be covered by the planarization layer 180.

The light emitting member 25 may include an organic light emitting diode (OLED) positioned on the planarization layer 180 and the pixel defining layer 350 for separating adjacent organic light emitting diodes (OLED) from each other.

The organic light emitting diode (OLED) may include a first electrode 191, an emission layer 192, and a second electrode 193 which are sequentially positioned on the planarization layer 180.

Specifically, the first electrode 191 is positioned on the planarization layer 180. A first electrode 191 is formed for each pixel, and is connected to the drain electrode 177 of a driving thin film transistor (TFT) through a via (hole) provided in the planarization layer 180. The pixel defining layer 350 is positioned on the planarization layer 180 and the first electrode 191.

The pixel defining layer 350 includes the first opening 351 to expose a central portion of the first electrode 191 at which the emission layer 192 is positioned.

The emission layer 192 is positioned on the first electrode 191, and the second electrode 193 is positioned on the emission layer 192 and the pixel defining layer 350. The second electrode 193 is formed on the entire display panel 100 and corresponds to a plurality of pixels. In a pixel, one of the first electrode 191 and the second electrode 193 injects holes into the emission layer 192, and the other injects electrons into the emission layer 192. The electrons and holes are combined with each other in the emission layer 192 to generate excitons, and light is emitted by energy generated when the excitons fall from an excited state to a ground state. The first electrode 191, the emission layer 192, and the second electrode 193 form the organic light emitting diode (OLED). The first electrode 191 may be formed as a reflective layer, and the second electrode 193 may be formed as a transparent layer or a semi-transparent layer. The light emitted from the emission layer 192 is reflected by the first electrode 191, and passes through the second electrode 193 and is emitted to the outside. In an embodiment, the second electrode 193 is a semi-transparent layer, and some of the light reflected by the first electrode 191 is re-reflected by the second electrode 193 to form a resonance structure, thereby improving light-extracting efficiency.

The pixel defining layer 350 includes the second opening 352 spaced apart from the first opening 351. The second opening 352 exposes an upper surface of the planarization layer 180. A first portion (or conductive material portion) of the second electrode 193 may be positioned inside the second opening 352 and my directly contact the upper surface of the planarization layer 180.

The thin film encapsulation layer 30 is formed on the second electrode 193 to cover the second electrode 193.

The organic light emitting diode (OLED) may be very vulnerable to moisture and oxygen, and thus the thin film encapsulation layer 30 seals the organic light emitting diode (OLED) to block inflow of the moisture and oxygen. The thin film encapsulation layer 30 may have a multilayer structure including an inorganic layer and an organic layer. The inorganic layer may include one of Al$_2$O$_3$, SiNx, and SiO$_x$. The organic layer may include one of epoxy, acrylate, and urethane acrylate. The thin film encapsulation layer 30 may be very thin, for advantageously enabling the display device to be desirably flexible.

The thin film encapsulation layer 30 is planarized (because it includes an organic layer). Accordingly, a distance d1 between the first portion of the second electrode 193 (positioned inside the second opening 352) and the upper surface of the thin film encapsulation layer 30 is greater than a distance d2 between a second portion of the second electrode 193 (positioned on the upper surface of the pixel defining layer 350) and the upper surface of the thin film encapsulation layer 30.

The light blocking layer 40 is positioned on the planarized thin film encapsulation layer 30. The light blocking layer 40 corresponds to and overlaps the thin film encapsulation layer 30. The light blocking layer 40 does not overlap the emission layer 192 positioned inside the first opening 351 of the pixel defining layer 350. The light blocking layer 40 overlaps the first portion of the second electrode 193 positioned inside the second opening 352 of the pixel defining layer 350. The light blocking layer 40 may substantially surround a plurality of pixels PX (in a plan view of the display device). A pixel PX, which is one light emitting unit, corresponds to an organic light emitting diode (OLED). In an embodiment, an area of the organic light emitting diode (OLED) may be defined as an area of light emitted through the first opening 351 of the pixel defining layer 350. Accordingly, an area of the pixel PX may be substantially the same as (i.e., equal to) that of the organic light emitting diode (OLED).

It is possible to enable and/or ensure a desirable viewing angle by forming a distance t1 between the adjacent (or immediately neighboring), spaced portions of the light blocking layer 40 in a cross-sectional view of the display device to be greater than a size/width t2 of the first opening 351 in the cross-sectional view of the display device.

By forming the light blocking layer 40 overlapping the pixel defining layer 350 to cover a part of the second electrode 193, it is possible to minimize external light reflected by the second electrode 193. Therefore, it is possible to optimize a reflection color of the display panel 100.

The touch sensor 200 is positioned on the light blocking layer 40.

The touch sensor 200 may include the first insulating layer 210 positioned on the light blocking layer 40, the sensing electrodes 241 and 242 positioned on the first insulating layer 210 and/or the second insulating layer 220, and a third insulating layer 230 positioned on the sensing electrodes 241 and 242.

The sensing electrodes 241 and 242 may include the first sensing electrodes 241 and the second sensing electrodes 242. A first sensing electrode 241 may include first sensing cells 241a and first connecting portions 241b connecting the first sensing cells 241a to each other. A second sensing electrode 242 may include second sensing cells 242a and second connecting portions 242b connecting the second sensing cells 242a to each other.

The first connecting portions 241b may be positioned on the first insulating layer 210. The second insulating layer 220 may be positioned on the first insulating layer 210 and the first connecting portions 241b. The first sensing cells 241a, the second sensing cells 242a, and the second connecting portions 242b may be positioned on the second insulating layer 220. The first sensing cells 241a, the first connecting portions 241b, the second sensing cells 242a, and the second connecting portions 242b may each include conductive fine wires 41.

FIG. 8 shows a cross-sectional view taken along line VIII-VIII of the portion P3 of the second sensing cells 242a shown in FIG. 6 and FIG. 7, and conductive fine wires 41 of a second sensing cell 242a are shown in FIG. 8.

As shown in FIG. 7, the pixel defining layer 350 includes the first opening 351 corresponding to (and exposing) the emission layer 192 and includes the second opening 352 corresponding to at least one of the light blocking layer 40 and a conductive wire 41. The pixel defining layer 350 does not overlap the conductive fine wires 41 in a direction perpendicular to a bottom face of the substrate 10, and a first portion of the second electrode 193 positioned inside the second opening 352 of the pixel defining layer 350 overlaps the conductive fine wires 41. In an embodiment, the distance d1 between the first portion of the second electrode 193 (positioned inside the second opening 352) and the light blocking layer 40 may be greater than the distance d2 between the second portion of the second electrode 193 (positioned on the upper surface of the pixel defining layer 350) and the light blocking layer 40.

By forming the second openings 352 of the pixel defining layer 350 at the position corresponding to the conductive fine wires 41, a distance d3 between the conductive fine wires 41 and the second electrode 193 may be maximized in a direction perpendicular to the substrate 10.

Therefore, parasitic capacitance between the conductive fine wires 41 and the second electrode 193 is minimized, such that touch sensitivity of the touch sensor 200 and/or of the display device may be optimized.

In an embodiment, since it is unnecessary to increase a thickness of the thin film encapsulation layer 30 to minimize the parasitic capacitance between the conductive fine wires 41 and the second electrode 193, it is advantageous for ensuring a desirable viewing angle (θ).

Figure 9:
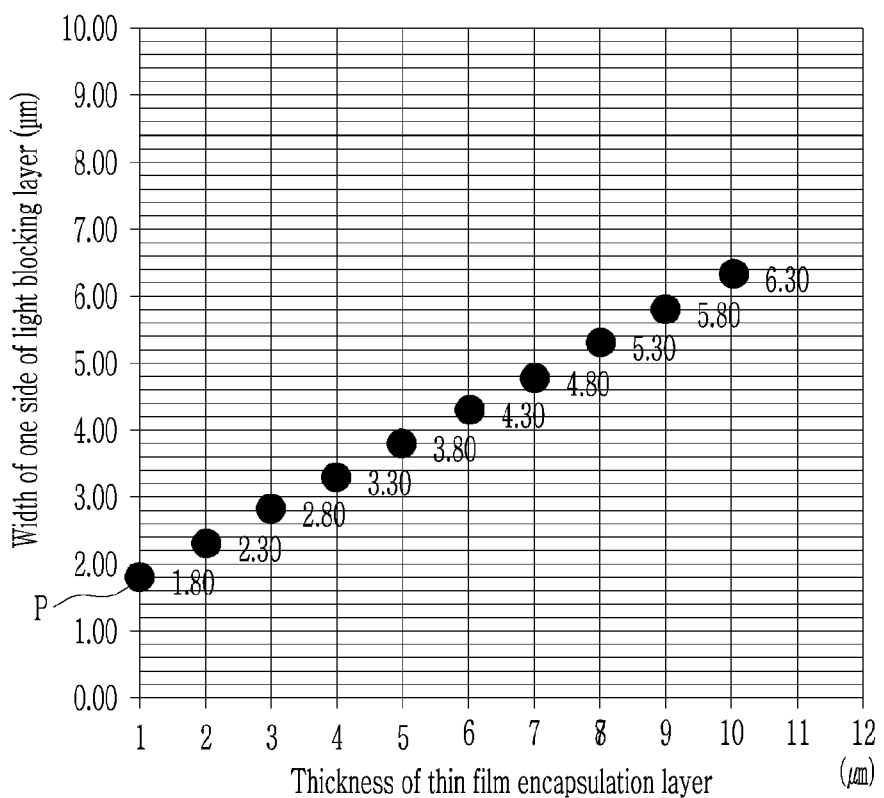
FIG. 9 is a graph showing conditions for enabling a viewing angle of 45 degrees by adjusting a width of one side of a light blocking layer according to a thickness of a thin film encapsulation layer according to an embodiment.
Figure 10:
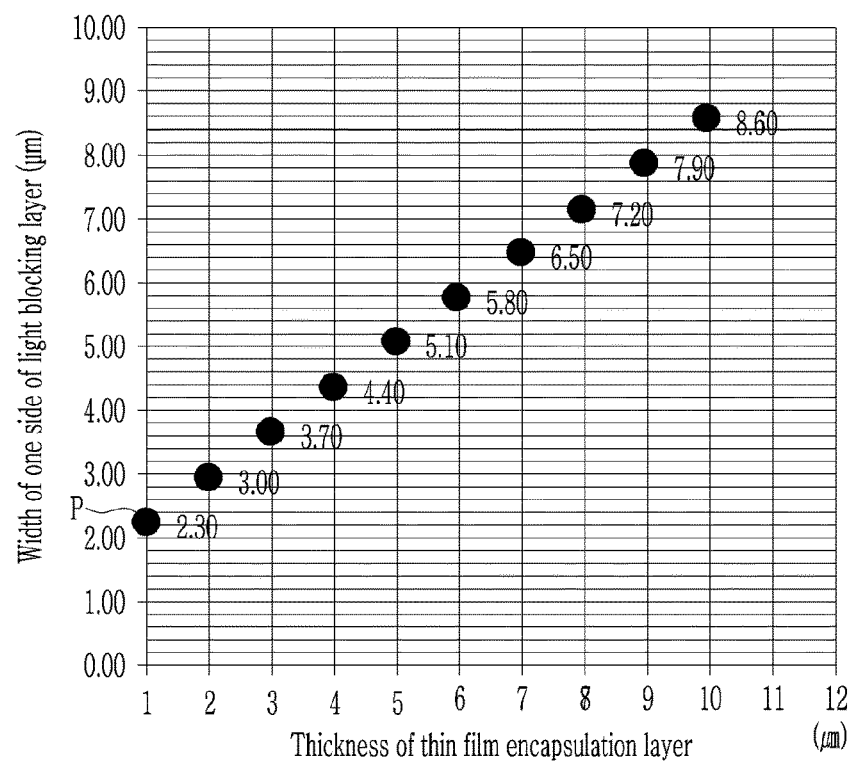
FIG. 10 is a graph showing conditions for enabling a viewing angle of 60 degrees by adjusting a width of one side of a light blocking layer according to a thickness of a thin film encapsulation layer according to an embodiment.

FIG. 9 is a graph showing conditions for enabling a viewing angle of 45 degrees by adjusting a width of one side of a light blocking layer according to a thickness of a thin film encapsulation layer according to an embodiment. FIG. 10 is a graph showing conditions for securing a viewing angle of 60 degrees by adjusting a width of one side of a light blocking layer according to a thickness of a thin film encapsulation layer according to an embodiment. In FIG. 9 and FIG. 10, dots (P) indicate a width of one side of the light blocking layer capable of enabling a viewing angle.

As shown in FIG. 9 and FIG. 10, for enabling viewing angles of 45 and 60 degrees, as the thickness of the thin film encapsulation layer 30 is increased, the width (w) of one side of the light blocking layer 40 should also be increased. Herein, the width (w) of one side of the light blocking layer 40 means a distance between an end portion of the emission layer 192 and an end portion of the light blocking layer 40 adjacent to the emission layer 192. Thus, as the thickness of the thin film encapsulation layer 30 is increased, a distance between the adjacent light blocking layers 40 should be increased. As a result, since reflection of external light increases, a reflection color may deteriorate.

In an embodiment, by forming the second opening 352 in the pixel defining layer 350, the thickness of the thin film encapsulation layer 30 need not be increased, and in an embodiment, since the distance between the light blocking layer 40 and the emission layer 192 is shortened, it is advantageous for enabling and/or ensuring a desirable viewing angle. Since the width (w) of one side of the light blocking layer 40 need not be increased for enabling the viewing angle, the reflection of external light is not increased, and the reflection color may not deteriorate.

Advantageously, embodiments may minimize reflection of external light, optimize reflection color, enabling a desirable viewing angle, and/or optimize touch sensitivity.

The display device may further include a polarizer 320 positioned on the touch sensor 200 and a window 340 positioned on the polarizer 320.

The polarizer 320 serves to minimize the reflection of external light, and the window 340 serves to protect the touch sensor 200 and the display panel 100 from external impact.

A first adhesive 310 is positioned between the third insulating layer 230 and the polarizer 320 to attach the third insulating layer 230 and the polarizer 320 to each other. In addition, a second adhesive 330 is positioned between the polarizer 320 and the window 340 to attach the polarizer 320 and the window 340 to each other.

The first insulating layer may be positioned on the light blocking layer in an embodiment. In an embodiment, a cover layer covering the light blocking layer may be positioned between the light blocking layer and the first insulating layer.

Figure 11:
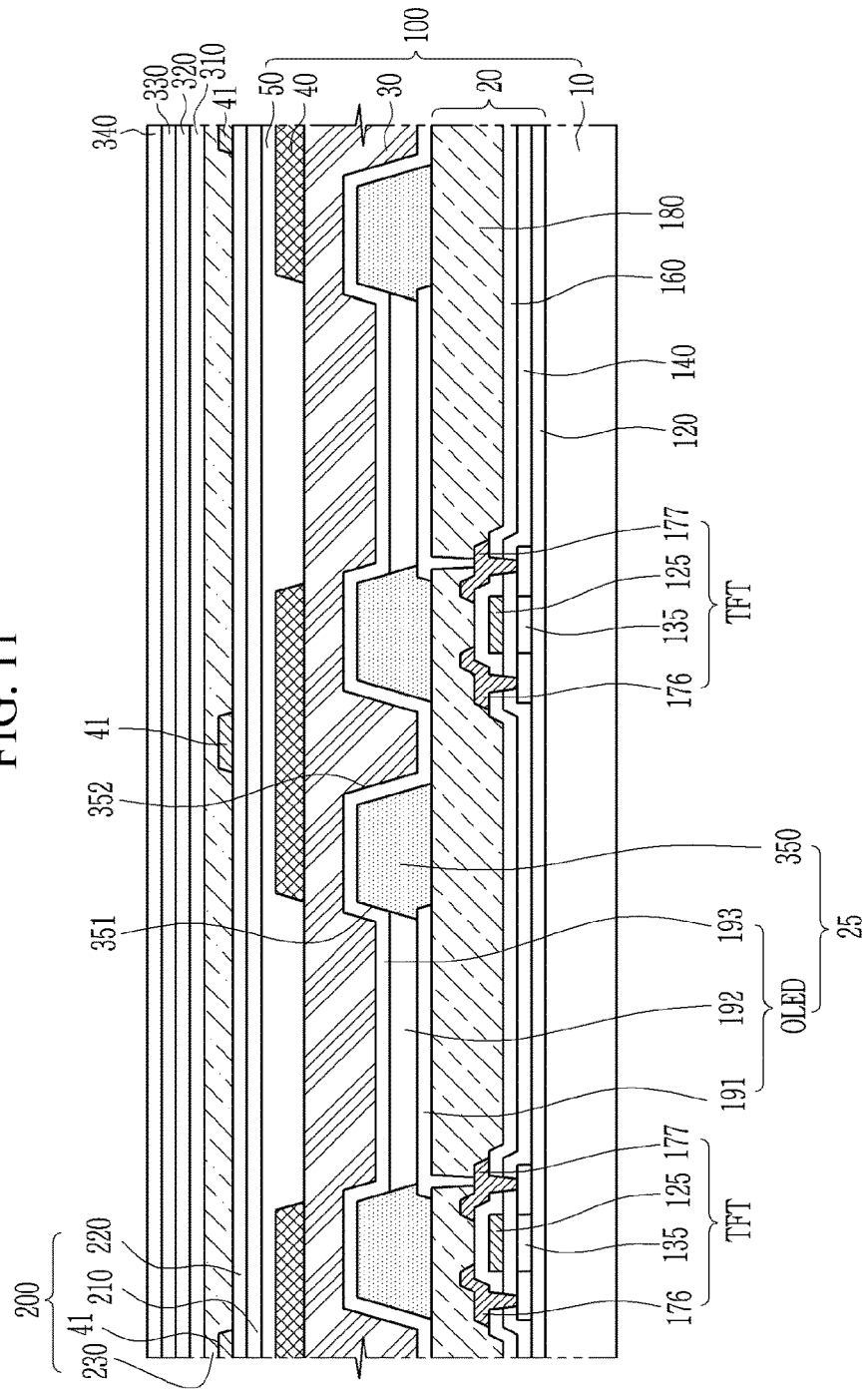
FIG. 11 illustrates a cross-sectional view of a display device according to an embodiment.

FIG. 11 illustrates a cross-sectional view of a display device according to an embodiment.

The display device shown in FIG. 11 may include elements and/or structures substantially the same as or analogous to elements and/or structures described with references to one or more of FIG. 1 to FIG. 10, and thus some description may not be repeated.

As shown in FIG. 11, in the display device, the light blocking layer 40 is positioned (directly) on the planarized thin film encapsulation layer 30. Portions of the light blocking layer 40 may correspond to portions of the thin film encapsulation layer 30 that are positioned inside second openings 352.

A cover layer 50 is positioned on the light blocking layer 40 and the thin film encapsulation layer 30. The cover layer 50 covers the light blocking layer 40 and the thin film encapsulation layer 30 to flatten an overall top surface. Thus, it is possible to minimize scattered reflection due to a step of the touch sensor 200 positioned on the cover layer 50.

The first insulating layer 210 may be positioned on the cover layer 50, the sensing electrodes 241 and 242 may be positioned on the first insulating layer 210 and/or the second insulating layer 220, and the third insulating layer 230 may be positioned on the sensing electrodes 241 and 242.

The cover layer 50 and the third insulating layer 230 may be made of an organic material. In an embodiment, the organic material may include one of an acrylic resin, a methacrylic resin, a polyisoprene, a vinyl resin, an epoxy resin, a urethane resin, a cellulose resin, a siloxane resin, a polyimide resin, a polyamide resin, and a combination.

The first adhesive 310, the polarizer 320, the second adhesive 330, and the window 340 may be sequentially positioned on the third insulating layer 230.

A polarizer for minimizing the reflection of external light is positioned on the touch sensor. In an embodiment, minimizing reflection of external light is enabled by a color filter and a light blocking layer.

Figure 12:
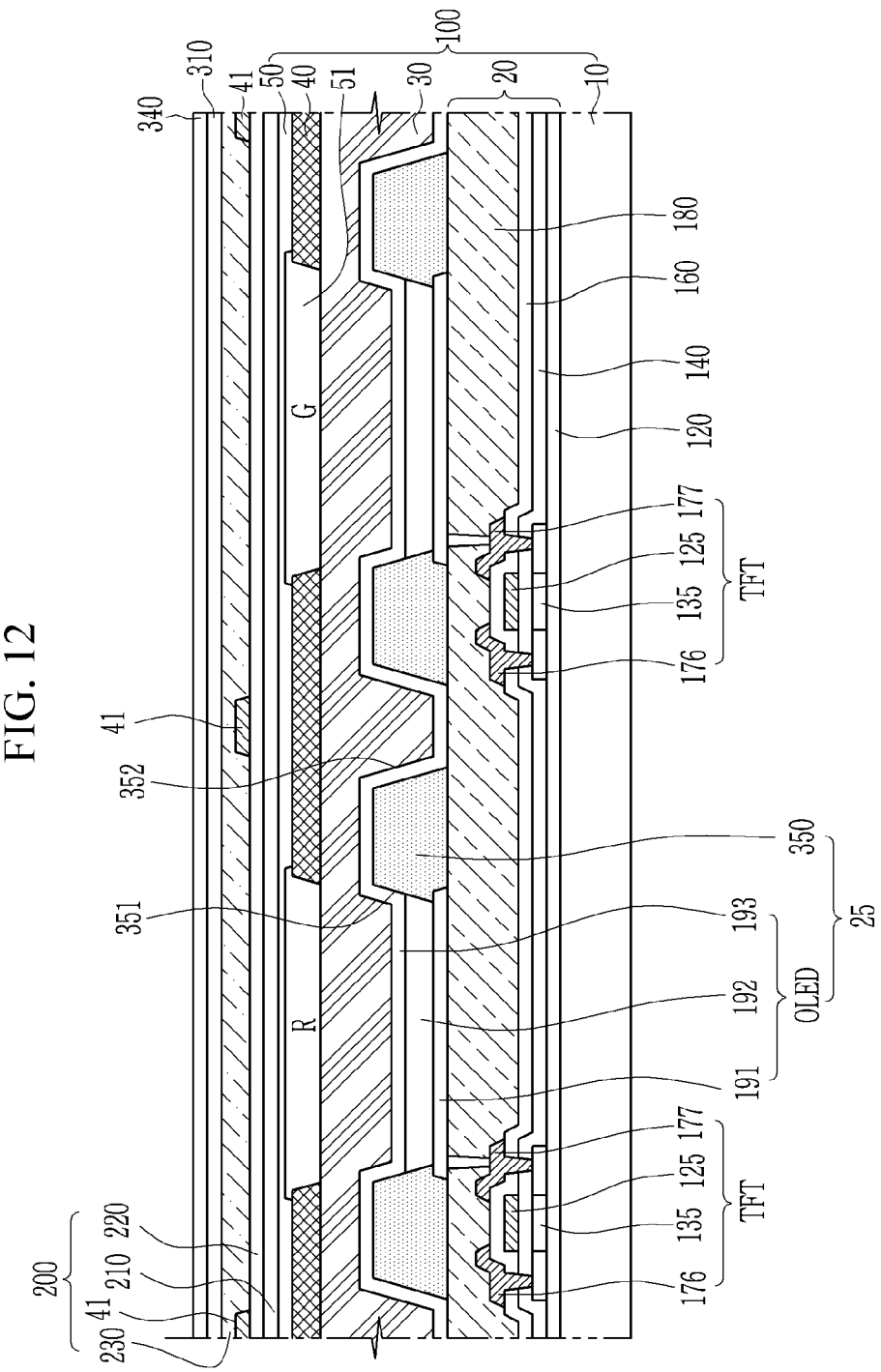
FIG. 12 illustrates a cross-sectional view of a display device according to an embodiment.

FIG. 12 illustrates a cross-sectional view of a display device according to an embodiment.

The display device shown in FIG. 12 may include elements and/or structures substantially the same as or analogous to elements and/or structures described with reference to one or more of FIG. 1 to FIG. 11, and thus some description may not be repeated.

As shown in FIG. 12, in the display device, the light blocking layer 40 is positioned on the planarized thin film encapsulation layer 30. Portions of the light blocking layer 40 may correspond to portions of the thin film encapsulation layer 30 that are positioned inside second openings 352.

A color filter 51 may be positioned between two spaced, adjacent (or immediately neighboring) portions of the light blocking layer 40. Color filters 51 may be positioned (directly) on the thin film encapsulation layer 30. The color filters 51 serve to minimize unwanted reflection of external light along with the light blocking layer 40. The light blocking layer 40 blocks external light from being reflected by the second electrode 193. A color filter 51 blocks reflected light of unwanted wavelengths and does not block reflected light of a wavelength corresponding to a color of the color filter 51. Thus, it is possible to minimize unwanted reflection of external light. For example, FIG. 12 shows a red color filter (R) and a green color filter (G). In an embodiment, the display device may include color filters 51 of other colors.

The color filters 51 do not overlap any of the conductive fine wires 41 in a direction perpendicular to the substrate 10. The cover layer 50 is positioned on the light blocking layer 40 and the color filter 51. The cover layer 50 covers the light blocking layer 40 and the color filter 51 to flatten an overall top surface. The first insulating layer 210 may be positioned on the cover layer 50, the sensing electrodes 241 and 242 may be positioned on the first insulating layer 210 and/or the second insulating layer 220, and the third insulating layer 230 may be positioned on the sensing electrodes 241 and 242. The cover layer 50 and the third insulating layer 230 may include an organic material.

The window 340 may be positioned on the third insulating layer 230. The first adhesive 310 for attaching the third insulating layer 230 and the window 340 to each other may be positioned between the third insulating layer 230 and the window 340.

Since no extra polarizer is required for minimizing unwanted reflection of external light, the thickness of the display device may be minimized.

While example embodiments have been described, practical embodiments are not limited to the described embodiments. Embodiments are intended to cover various modifications and equivalent arrangements within the spirit and scope of the appended claims.

What is claimed is:

1. A display device comprising:
a substrate;
a switching composite layer positioned on the substrate;
a first electrode positioned on the switching composite layer;
a pixel defining layer covering an edge of the first electrode and having a first opening and a second opening that are spaced from each other;
an emission layer positioned inside the first opening;
a second electrode covering the switching composite layer, the pixel defining layer, and the emission layer;
an encapsulation layer covering the second electrode;
a light blocking layer positioned on the encapsulation layer; and
a touch sensor positioned on the light blocking layer and including a sensing electrode set,
wherein a material portion is positioned inside the second opening of the pixel defining layer, overlaps a light blocking material part of the light blocking layer, and overlaps the sensing electrode set, and
wherein the light blocking material part of the light blocking layer is wider than the second opening of the pixel defining layer.

2. The display device of claim 1, wherein
the sensing electrode set includes a mesh structure comprising conductive wires that are electrically connected to each other and include a first conductive wire, and
the material portion overlaps the first conductive wire.

3. The display device of claim 2, wherein
the light blocking layer overlaps the pixel defining layer.

4. The display device of claim 3, wherein
a center portion of the light blocking material part of the light blocking layer overlaps the material portion.

5. The display device of claim 2, wherein
the first conductive wire is spaced from the material portion.

6. The display device of claim 2, wherein
the material portion is a first portion of the second electrode and directly contacts the switching composite layer.

7. The display device of claim 6, wherein
a distance between the material portion and the light blocking layer is greater than a distance between a second portion of the second electrode and the light blocking layer,
the second portion of the second electrode is positioned between the pixel defining layer and the light blocking layer in a direction perpendicular to the substrate.

8. The display device of claim 7, wherein
a distance between the material portion and a flat surface of the encapsulation layer is greater than a distance between the second portion of the second electrode positioned and the flat surface of the encapsulation layer, and
the flat surface of the encapsulation layer is parallel to the substrate.

9. The display device of claim 2, wherein
a distance between two spaced and immediately neighboring portions of the light blocking layer in a cross-sectional view of the display device is greater than a width of the first opening in the cross-sectional view of the display device.

10. The display device of claim 2, wherein
the sensing electrode set includes a first sensing electrode and a second sensing electrode spaced from each other in a plan view of the display device,
the touch sensor includes
a first insulating layer positioned between the light blocking layer and the sensing electrode set, and
a second insulating layer including an insulating portion positioned between the first sensing electrode and the second sensing electrode, and
the second insulating layer includes an inorganic material.

11. The display device of claim 10, wherein
the touch sensor includes a third insulating layer covering the sensing electrode set, and
the third insulating layer includes an organic material.

12. The display device of claim 2, wherein
the emission layer is positioned between two immediately neighboring conductive wires of the conductive wires.

13. The display device of claim 2, further comprising
a polarizer positioned on the touch sensor, and
a window positioned on the polarizer.

14. The display device of claim 2, further comprising
a cover layer positioned between the light blocking layer and the touch sensor.

15. The display device of claim 14, wherein
the cover layer includes an organic material.

16. The display device of claim 14, wherein
the sensing electrode set includes a first sensing electrode and a second sensing electrode spaced from each other in a plan view of the display device,
the touch sensor includes
a first insulating layer positioned between the light blocking layer and the sensing electrode set, and
a second insulating layer including an insulating portion positioned between the first sensing electrode and the second sensing electrode,
the second insulating layer includes an inorganic material, and
the cover layer is positioned between the light blocking layer and the first insulating layer.

17. The display device of claim 2, further comprising
a color filter positioned between two spaced and immediately neighboring portions of the light blocking layer,
wherein the color filter is positioned directly on the encapsulation layer.

18. The display device of claim 17, wherein
the color filter does not overlap any conductive wire of the sensing electrode set in a direction perpendicular to the substrate.

19. The display device of claim 17, further comprising
a cover layer covering the light blocking layer and the color filter,
wherein the sensing electrode set includes a first sensing electrode and a second sensing electrode spaced from each other in a plan view of the display device,
the touch sensor includes
a first insulating layer positioned between the light blocking layer and the sensing electrode set, and
a second insulating layer including an insulating portion positioned between the first sensing electrode and the second sensing electrode,
the second insulating layer includes an inorganic material, and
the cover layer is positioned between the light blocking layer and the first insulating layer.

20. The display device of claim 19, wherein
the cover layer includes an organic material.

* * * * *